(12) United States Patent
Managaki

(10) Patent No.: US 10,923,558 B2
(45) Date of Patent: Feb. 16, 2021

(54) DISPLAY DEVICE AND METHOD OF MANUFACTURING DISPLAY DEVICE

(71) Applicant: Japan Display Inc., Minato-ku (JP)

(72) Inventor: Nobuto Managaki, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/735,869

(22) Filed: Jan. 7, 2020

(65) Prior Publication Data
US 2020/0219961 A1    Jul. 9, 2020

(30) Foreign Application Priority Data

Jan. 7, 2019 (JP) ................................ 2019-000711

(51) Int. Cl.
| | | |
|---|---|---|
| *H01L 27/32* | (2006.01) | |
| *H01L 23/48* | (2006.01) | |
| *H01L 51/00* | (2006.01) | |
| *H01L 25/18* | (2006.01) | |
| *H01L 23/498* | (2006.01) | |
| *H01L 25/00* | (2006.01) | |
| *H01L 21/768* | (2006.01) | |
| *H01L 27/12* | (2006.01) | |

(52) U.S. Cl.
CPC .... *H01L 27/3276* (2013.01); *H01L 21/76898* (2013.01); *H01L 23/481* (2013.01); *H01L 23/4985* (2013.01); *H01L 25/18* (2013.01); *H01L 25/50* (2013.01); *H01L 27/3248* (2013.01); *H01L 51/0097* (2013.01); *H01L 27/124* (2013.01); *H01L 27/1218* (2013.01); *H01L 27/1259* (2013.01); *H01L 2227/323* (2013.01); *H01L 2251/5338* (2013.01)

(58) Field of Classification Search
CPC ............. H01L 27/3276; H01L 27/3248; H01L 27/3258; H01L 21/76898; H01L 21/486; H01L 51/5203; H01L 51/0097; H01L 51/5246

See application file for complete search history.

(56) References Cited

U.S. PATENT DOCUMENTS

| | | | |
|---|---|---|---|
| 7,411,569 B2 * | 8/2008 | Okazaki | ............. H01L 27/3253 345/55 |
| 9,312,510 B2 * | 4/2016 | Akimoto | ............... H01L 51/003 |
| 9,871,092 B2 * | 1/2018 | Ookawara | ........... H01L 27/3276 |

FOREIGN PATENT DOCUMENTS

JP    2010-008677 A    4/2014

* cited by examiner

*Primary Examiner* — Jose R Diaz
(74) *Attorney, Agent, or Firm* — Oblon, McClelland, Maier & Neustadt, L.L.P.

(57) ABSTRACT

A display device according to an embodiment of the present invention includes: a substrate that includes a display region and a peripheral region; a display element that is provided on the display region of the substrate; and an electronic component that is provided in the peripheral region on an opposite surface from a surface of the substrate on which the display element is provided, wherein the substrate includes one or more through holes in the peripheral region, the one or more through holes include a through electrode formed by a laminate structure of a plurality of conductive layers, and the through electrodes electrically connect the display element to the electronic component.

8 Claims, 18 Drawing Sheets

DISPLAY DEVICE AND METHOD OF MANUFACTURING DISPLAY DEVICE

CROSS-REFERENCE TO RELATED APPLICATION

The present application claims priority from Japanese application JP2019-000711 filed on Jan. 7, 2019, the content of which is hereby incorporated by reference into this application.

BACKGROUND OF THE INVENTION

1. Field of the Invention

The present invention relates to a display device and a method of manufacturing the display device.

2. Description of the Related Art

In recent years, plane display devices including liquid crystal display devices or organic electroluminescence displays (OLEDs) are widely used as image display devices for various computers, portable terminal devices, and the like.

In the plane display devices, display gray scales of pixels are controlled by thin film transistors (TFTs). Since it is necessary to supply current to each of the plurality of pixels including the thin film transistors, connection with external circuits or the like is made and a current is supplied.

In some display devices of the related art, a via is provided in a substrate in which a plurality of thin film transistors are formed through a via last process (for example, see JP 2010-008677 A). The via last process is a process of forming a via hole exposing an electrode electrically connected to a thin film transistor on the rear surface side of a substrate in which a plurality of thin film transistors are formed. The display device includes a through electrode in the formed via and includes an external circuit or the like on the rear surface side of the substrate. An electrode electrically connected to the thin film transistor by the through electrode is electrically connected to an external circuit or the like.

SUMMARY OF THE INVENTION

However, as in the display device disclosed in JP 2010-008677 A described above, moisture intruding on a lateral sectional surface of the through hole may be likely to spread to a display region or the like through a layer when a through electrode and an external circuit are included by a via last process, and thus reliability of the display device may deteriorate.

The present invention is devised in view of the foregoing problems and an object of the present invention is to provide a display device capable of preventing intrusion of moisture from a lateral surface of a formed through hole when an external circuit such as an electronic component is mounted on a rear surface side of a peripheral region of a substrate including a thin film transistor.

A display device according to an embodiment of the present invention includes: a substrate that includes a display region and a peripheral region; a display element that is provided on the display region of the substrate; and an electronic component that is provided in the peripheral region on an opposite surface from a surface of the substrate on which the display element is provided, wherein the substrate includes one or more through holes in the peripheral region, the one or more through holes include a through electrode formed by a laminate structure of a plurality of conductive layers, and the through electrodes electrically connect the display element to the electronic component.

A method of manufacturing a display device including a substrate that includes a display region and a peripheral region, a display element that is provided on the display region of the substrate, and an electronic component that is provided in the peripheral region on an opposite surface from a surface of the substrate on which the display element is provided, the method according to an embodiment of the present invention includes: forming one or more through holes in the peripheral region of the substrate; forming a through electrode formed by a laminate structure of a plurality of conductive layers in the one or more through holes; and electrically connecting the through electrodes to the electronic component that is provided on an opposite surface from a surface of the substrate on which the display element is provided among the one or more through holes.

DETAILED DESCRIPTION OF THE INVENTION

Figure 1:
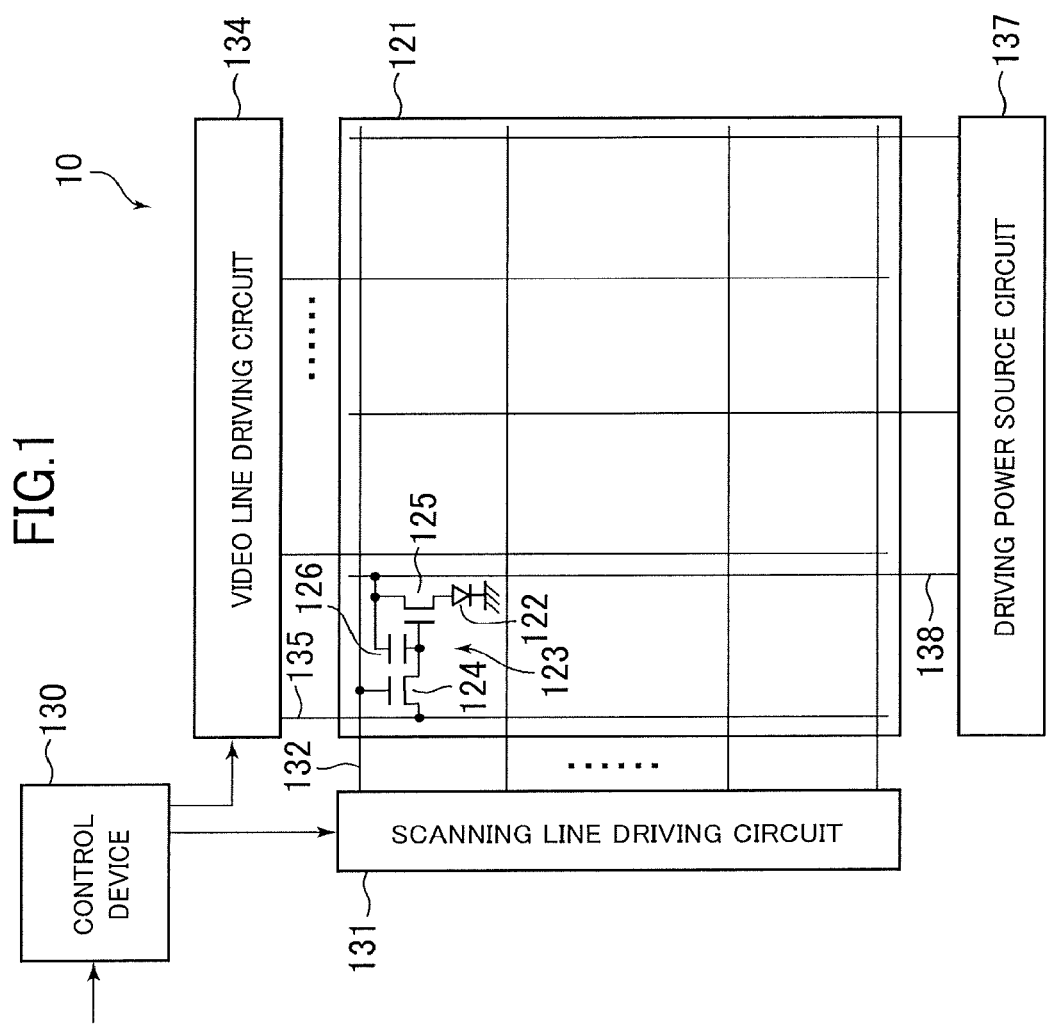
FIG. 1 is a schematic diagram illustrating an overall configuration of a display device according to an embodiment of the present invention.

Hereinafter, embodiments of the present invention will be described with reference to the drawings. The present disclosure is merely exemplary and it is apparent to those skilled in the art that appropriate modifications can be made easily within the gist of the present invention and are, of course, included in the scope of the present invention. The drawings are illustrated in the width, thickness, shape, and the like of each unit more schematically than in the actual aspect to further clarify the description and merely exemplary, and are not construed as limiting interpretation of the present invention. In the present specification and each drawing, the same reference numerals are given to elements that have functions similar to those described in the previously described drawings and repeated description will be omitted in some cases.

In the detailed description of the embodiment of the present invention, when a positional relationship between a certain structure and another structure, "on", "above", and "below" refers to not only a case where one structure is positioned directly on or directly below another structure but also a case where still another structure is interposed between the components unless otherwise stated.

FIG. 1 is a schematic diagram illustrating an overall configuration of a display device 10 according to an embodiment of the present invention. The display device 10 according to the embodiment is, for example, an organic EL display device.

In a pixel array unit 121, a pixel circuit 123 that includes pluralities of light-emitting elements 122 serving as organic light-emitting diodes (OLEDs) and thin film transistors (TFTs) to correspond to pixels are disposed in a matrix form. The pixel circuit 123 includes a lighting TFT 124, a driving TFT 125, and a capacitor 126.

On the other hand, a driving unit that drives the pixel array unit 121 includes a control device 130, a scanning line driving circuit 131, a video line driving circuit 134, and a driving power source circuit 137. The driving unit drives the pixel circuit 123 to control light emission of the light-emitting elements 122.

The scanning line driving circuit 131 is connected to a scanning signal line 132 provided for each line (pixel row) in the horizontal direction of the pixels. The scanning line driving circuit 131 sequentially selects the scanning signal lines 132 according to a timing signal input from the control device 130. Then, a voltage for turning on the lighting TFTs 124 is applied to the selected scanning signal line 132.

The video line driving circuit 134 is connected to a video signal line 135 provided for each line (pixel column) in the vertical direction of the pixels. A video signal is input from the control device 130 and the video line driving circuit 134 outputs a voltage according to the video signal of the selected pixel row to each video signal line 135 in conformity with selection of the scanning signal line 132 by the scanning line driving circuit 131. The voltage is written on the capacitor 126 via the lighting TFT 124 in the selected pixel row. The driving TFT 125 supplies a current according to the written voltage to the light-emitting element 122. Thus, the light-emitting elements 122 of the pixels corresponding to the selected scanning signal line 132 emit light.

The driving power source circuit 137 is connected to a driving power source line 138 provided for each pixel column and a current is supplied to the light-emitting element 122 via the driving TFTs 125 of the selected pixel row and the driving power source line 138.

Here, a lower electrode of the light-emitting element 122 is connected to the driving TFT 125. On the other hand, an upper electrode of each light-emitting element 122 is configured as a common electrode of the light-emitting elements 122 of all the pixels. When the lower electrode serves as an anode, a high potential is input. The upper electrode serves as a cathode and a low potential is input. When the lower electrode serves as a cathode, a low potential is input. The upper electrode serves as an anode and a high potential is input.

Figure 2:
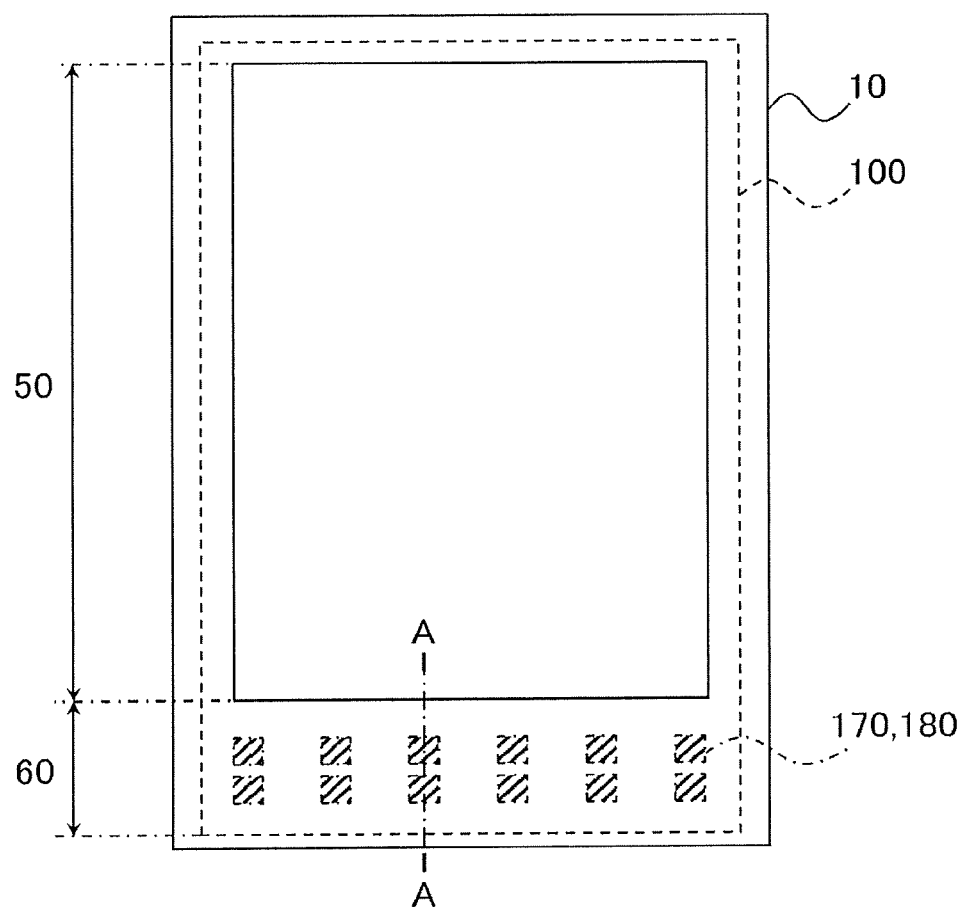
FIG. 2 is a schematic plan view illustrating the display device according to the embodiment of the present invention.

FIG. 2 is a schematic plan view illustrating the display device 10 according to the embodiment of the present invention. The pixel array unit 121 illustrated in FIG. 1 is provided in a display region 50 of a substrate 100. As described above, the light-emitting elements 122 are arrayed in the pixel array unit 121. The upper electrode included in the light-emitting element 122 is formed to be common to each pixel and covers the entire display region 50.

First Embodiment

Figure 3:
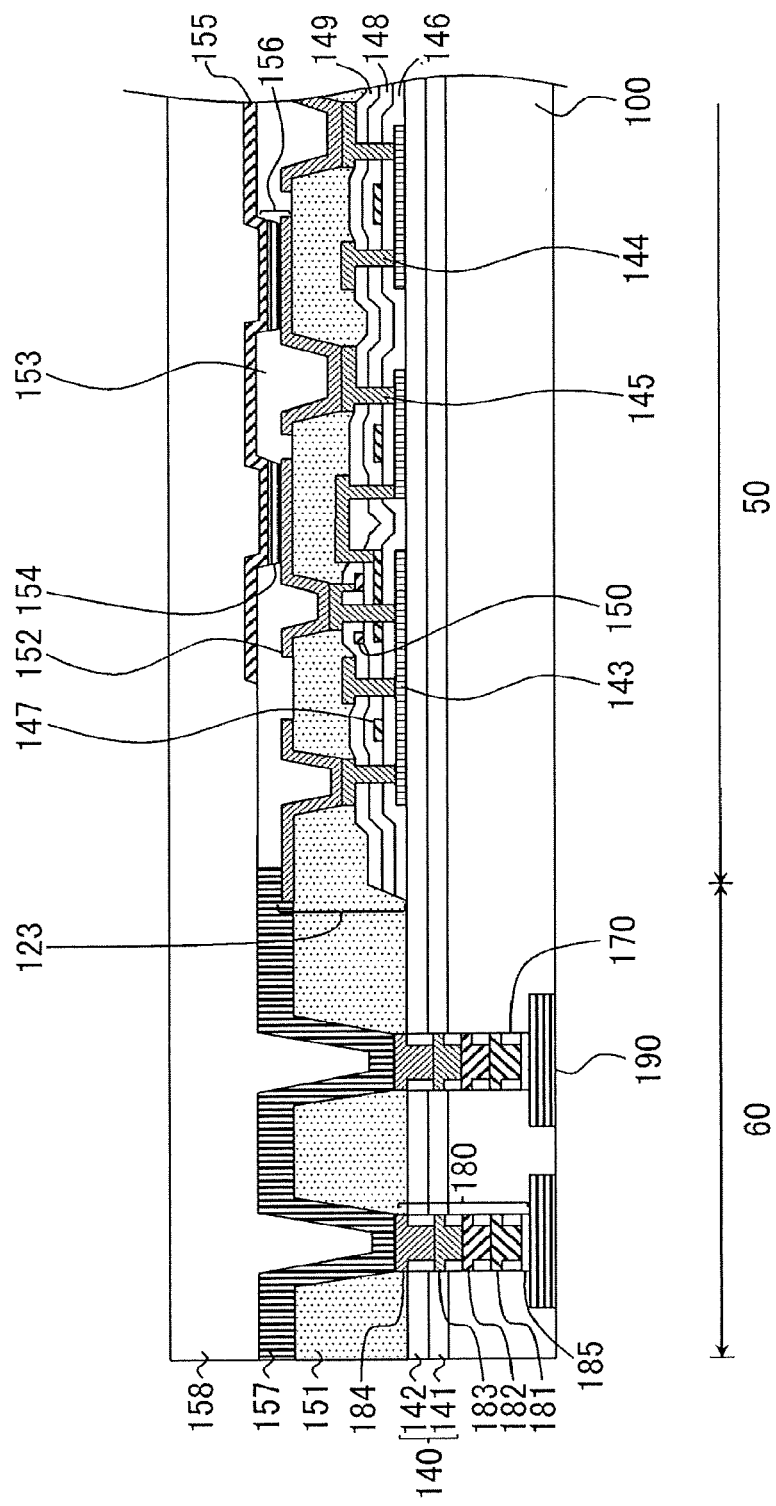
FIG. 3 is a schematic vertical sectional view taken along the cross-sectional surface A-A of the display device according to a first embodiment of the present invention.

Hereinafter, the display device 10 according to a first embodiment of the present invention will be described with reference to FIGS. 3 to 10. FIG. 3 is a schematic vertical sectional view taken along the cross-sectional surface A-A of FIG. 2 in a display substrate included in the display device 10 according to the first embodiment of the present invention. As illustrated in FIG. 3, the pixel circuits 123 are formed in a matrix form above the substrate 100.

The substrate 100 is formed of an insulating material. For example, the substrate 100 is more preferably formed of a material with flexibility, such as a polyimide resin or polyethylene terephthalate, among insulating materials. When the substrate 100 has flexibility, the display device 10 is also configured to be bendable.

The pixel circuit 123 is formed above an underlying layer 140 serving as a barrier for impurities contained by the substrate 100. The underlying layer 140 may be formed of any material as long as the material is an inorganic material that has an insulating property such as a silicon oxide ($SiO_x$) or a silicon nitride ($SiN_y$). In the embodiment, the underlying layer 140 has a laminate structure of a first underlying layer 141 and a second underlying layer 142, but may be configured as a single layer.

The underlying layer 140 and the substrate 100 in a peripheral region 60 include a through hole (via) 170. A through electrode 180 is provided in the through hole 170. A process of forming the through hole 170 and the through electrode 180 will be described in detail in a process of manufacturing a display substrate of the display device 10 to be described below with reference to FIGS. 4 to 9.

An electronic component 190 is provided on a rear surface side of the substrate 100 to be electrically connected to the through electrode 180. The electronic component 190 is a component that supplies power to the lighting TFT 124 and the driving TFT 125 from the outside. The electronic component 190 is, for example, an integrated circuit (driver IC) or a flexible printed substrate (FPC). The through electrode 180 is electrically connected to a conductive film 157 to be described below on the front surface side of the substrate 100. That is, the electronic component 190 is electrically connected to the conductive film 157 via the through electrode 180.

A semiconductor layer 143 is provided above the underlying layer 140. Subsequently, a gate insulation film 146 is provided to cover the semiconductor layer 143. A gate electrode 147 is provided above the gate insulation film 146. Thereafter, a first inter-layer insulation film 148 is provided to cover the gate electrode 147 and a second inter-layer insulation film 149 is provided above the first inter-layer insulation film 148. Then, a wiring layer 150 is provided between the first inter-layer insulation film 148 and the second inter-layer insulation film 149. The wiring layer 150 corresponds to a signal line in a row direction. The gate insulation film 146, the first inter-layer insulation film 148, and the second inter-layer insulation film 149 may be formed of any material as long as the material is an inorganic material that has an insulating property as in the underlying layer 140.

A source electrode 144 and a drain electrode 145 are electrically connected to the semiconductor layer 143 by a contact hole formed through the gate insulation film 146, the first inter-layer insulation film 148, and the second inter-layer insulation film 149. As described above, at least a part of the driving TFT 125 is formed by the semiconductor layer 143, the source electrode 144, the drain electrode 145, and the gate electrode 147.

A passivation film 151 is provided to cover the driving TFT 125. A plurality of pixel electrodes 152 (lower electrodes serving as, for example, an anode) are provided above the passivation film 151 to correspond to the plurality of pixels. The passivation film 151 is formed so that a surface on which at least the pixel electrode 152 is provided is flat. Therefore, the passivation film 151 also serves as a flattened film. The passivation film 151 is formed of an insulating material and is formed of, for example, an organic material such as a photosensitive acrylic resin.

The pixel electrode 152 is electrically connected to one of the source electrode 144 and the drain electrode 145 above the semiconductor layer 143. In the embodiment, as illustrated in FIG. 3, the pixel electrode 152 is electrically connected to the drain electrode 145. A contact hole in the passivation film 151 is formed using a known method such as photolithography.

A bank (rib) 153 surrounding the pixel electrode 152 is provided above the passivation film 151. The bank 153 partitions the plurality of pixels disposed in the display region 50 illustrated in FIG. 2. The bank 153 is also formed of, for example, an organic material such as a photosensitive acrylic resin like the passivation film 151.

A light-emitting layer 154 is provided above the pixel electrode 152. The light-emitting layer 154 is separately provided (separated) for each pixel electrode 152 and emits blue, red, or green light to correspond to each pixel. The color corresponding to each pixel is not limited thereto. For example, yellow, white, or the like may be added. The light-emitting layer 154 is formed by, for example, deposition. Alternatively, the light-emitting layer 154 may be formed across the plurality of pixels on the entire surface covering the display region 50 illustrated in FIG. 2. That is, the light-emitting layer 154 may be formed to continue on the passivation film 151 and the pixel electrode 152. Here, the light-emitting layer 154 is formed by, for example, application using a dispersant. When the light-emitting layer 154 is formed across the plurality of pixels, white light is emitted in all the sub-pixels and desired color wavelengths are extracted through color filters (not illustrated).

A common electrode 155 (the upper electrode serving as, for example, a cathode) is provided above the light-emitting layer 154. The common electrode 155 is also provided above the bank 153 to continue. Therefore, the common electrode 155 continues above the adjacent pixel electrodes 152. The light-emitting layer 154 is interposed between the pixel electrode 152 and the common electrode 155 and emits light in such a manner that luminance is controlled by a current flowing therebetween. At least one layer of a hole transport layer and a hole injection layer (not illustrated) may be provided between the pixel electrode 152 and the light-emitting layer 154. At least one layer of an electron transport layer and an electron injection layer (not illustrated) may be provided between the light-emitting layer 154 and the common electrode 155. As described above, at least a part of a light-emitting element 156 is formed from the pixel electrode 152, the light-emitting layer 154, and the common electrode 155.

The conductive film 157 is provided above the passivation film 151 in the peripheral region 60. The conductive film 157 is electrically connected to the common electrode 155 and the through electrode 180. In the passivation film 151 above the common electrode 155 and the through electrode 180, a contact hole is formed using a known method such as photolithography.

A sealing film 158 is provided above the common electrode 155 and the conductive film 157. Thus, the common electrode 155, the light-emitting element 156, and the conductive film 157 are isolated from moisture. The sealing film 158 may be formed of any material as long as the material is an inorganic material that has an insulating property such as a silicon oxide ($SiO_x$) or a silicon nitride ($SiN_y$) and is an inorganic material that has a light transmission property. The sealing film 158 may have a laminate structure formed from the above-described inorganic material. For example, a structure in which a pair of inorganic layers vertically interpose an organic layer of, for example, a resin such as acryl.

Figure 4:
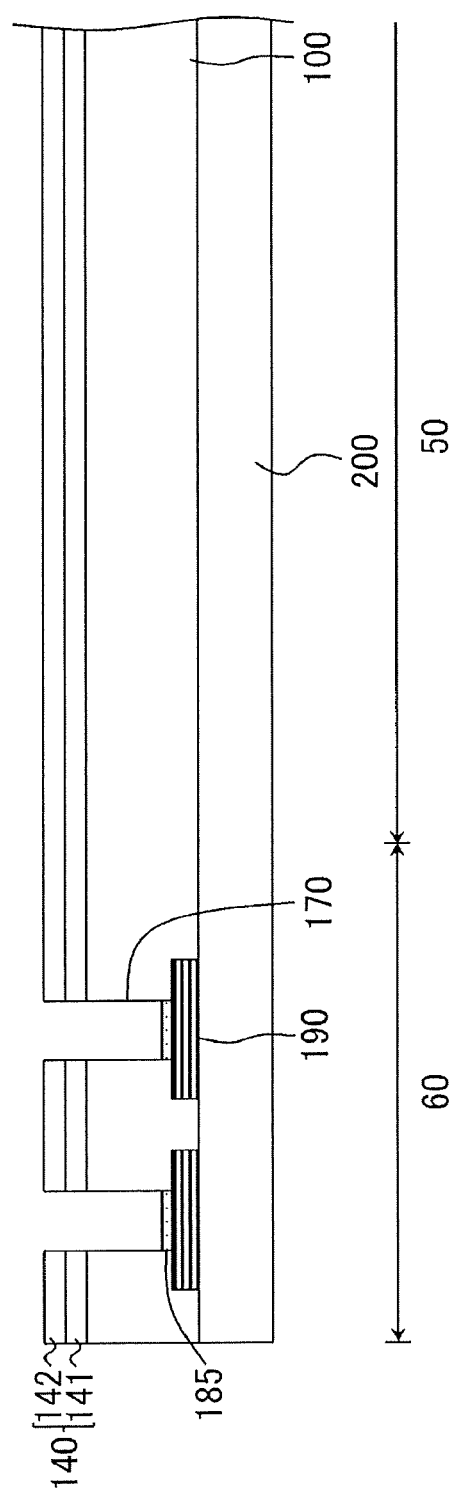
FIG. 4 is a schematic vertical sectional view taken along the cross-sectional surface A-A of FIG. 2 to describe a process of manufacturing the display device according to the first embodiment of the present invention.

Hereinafter, a process of manufacturing a display substrate of the display device 10 illustrated in FIG. 3 will be described with reference to FIGS. 4 to 9. FIG. 4 is a schematic vertical sectional view illustrating the substrate 100 after the process of forming the through hole 170 on the cross-sectional surface A-A of FIG. 2.

First, the substrate 100 is formed above a glass substrate 200. Here, after the electronic component 190 (for example, a driver IC or the like) is provided in advance above the substrate 200, the substrate 100 is formed. Here, the electronic component 190 has a structure in which the electronic component 190 is buried in the substrate 100.

The underlying layer 140 is formed above the substrate 100. In the embodiment, the first underlying layer 141 and the second underlying layer 142 are sequentially formed from the side of the substrate 100.

After the underlying layer 140 is formed, as illustrated in FIG. 4, the through hole 170 from the underlying layer 140 to the electronic component 190 is formed using a known method such as photolithography. Then, a conductive material 185 is provided on the electronic component 190 exposed from the through hole 170. The conductive material 185 may be any material as long as the material is a material in which a terminal portion included in the electronic component 190 is electrically connected to a first through electrode layer 181 to be described below.

Figure 5:
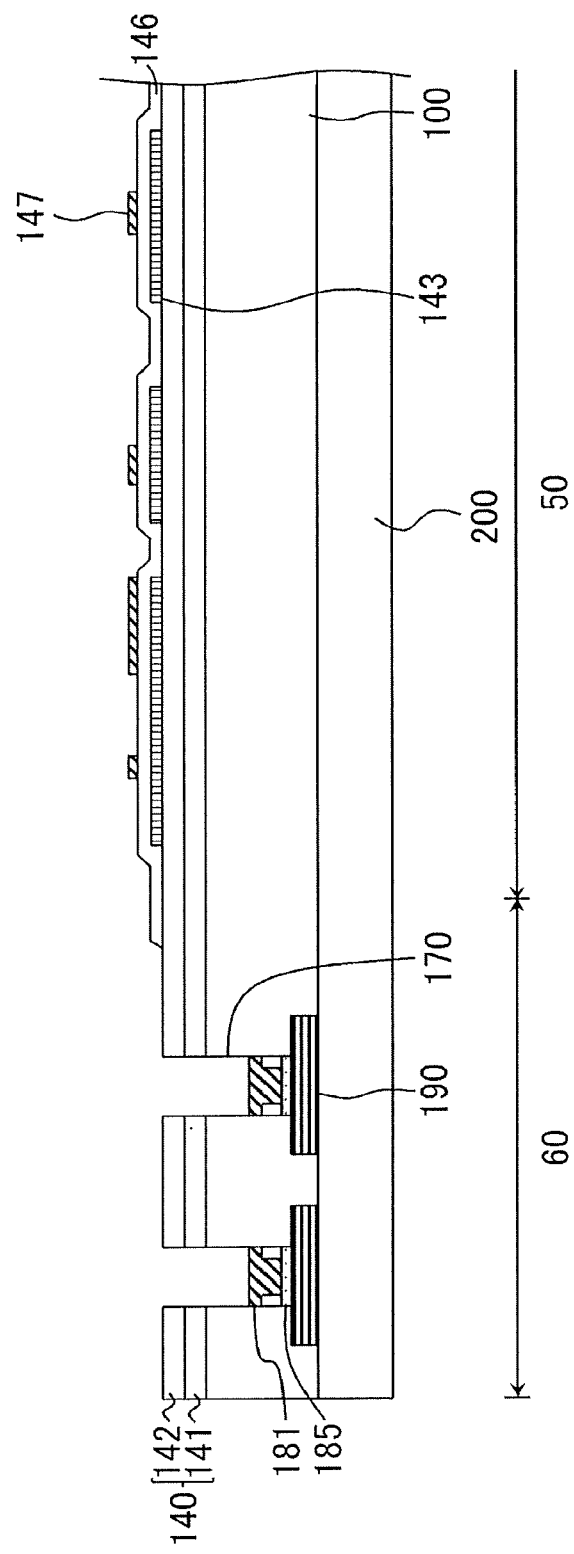
FIG. 5 is a schematic vertical sectional view taken along the cross-sectional surface A-A of FIG. 2 to describe the process of manufacturing the display device according to the first embodiment of the present invention.

FIG. 5 is a schematic vertical sectional view illustrating a display substrate of the display device 10 after the process of forming the gate electrode 147 on the cross-sectional surface A-A of FIG. 2. After a process of providing the conductive material 185 above the electronic component 190 of the through hole 170, the semiconductor layer 143 is formed above the underlying layer 140. Here, the semiconductor layer 143 is formed above the second underlying layer 142. Then, the gate insulation film 146 is formed on the underlying layer 140 to cover the semiconductor layer 143. Moreover, the gate electrode 147 is formed on the gate insulation film 146 so that the gate electrode 147 is immediately above the semiconductor layer 143.

In the process of forming the gate electrode 147, the first through electrode layer 181 is also formed in the through hole 170. Therefore, the gate electrode 147 and the first through electrode layer 181 are formed of the same material and in the same process. Thus, the conductive material 185 and the first through electrode layer 181 are electrically connected to each other.

Figure 6:
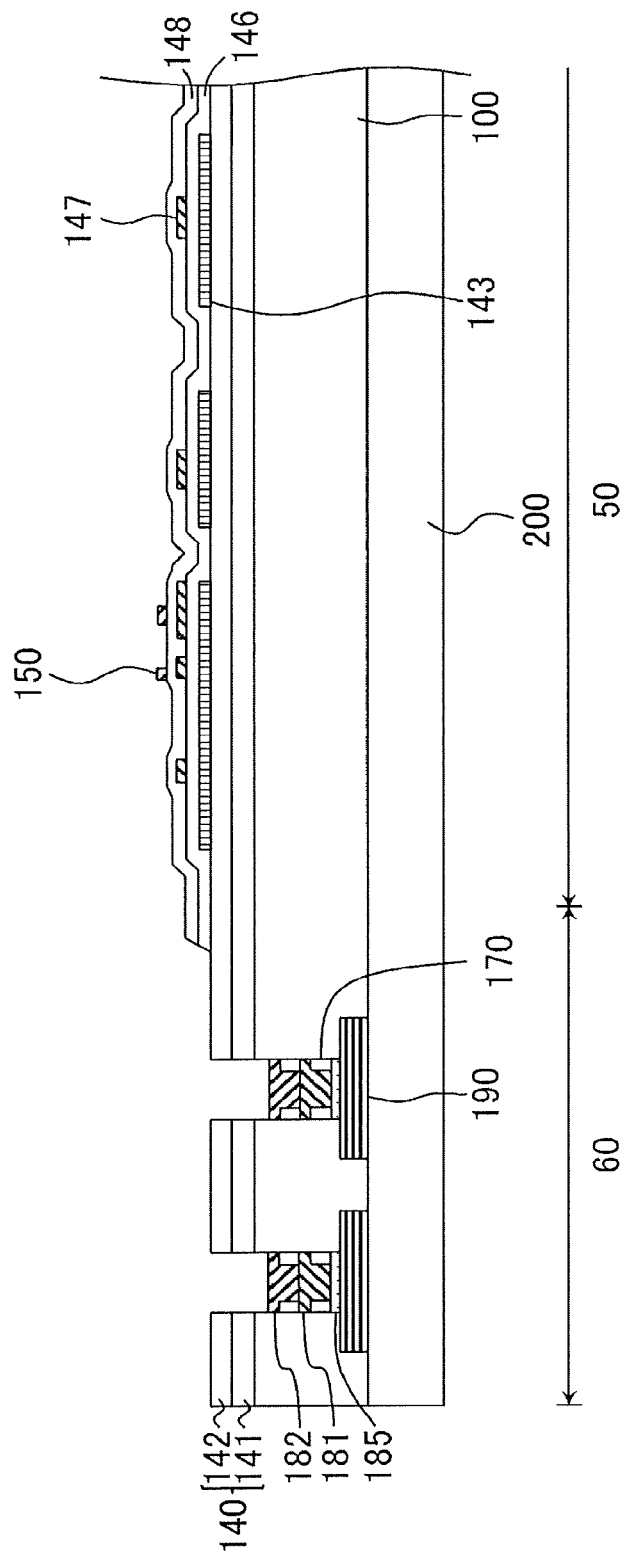
FIG. 6 is a schematic vertical sectional view taken along the cross-sectional surface A-A of FIG. 2 to describe the process of manufacturing the display device according to the first embodiment of the present invention.

FIG. 6 is a schematic vertical sectional view illustrating the display substrate of the display device 10 after the process of forming the wiring layer 150 on the cross-sectional surface A-A of FIG. 2. After the gate electrode 147 and the first through electrode layer 181 are formed, the first inter-layer insulation film 148 is formed above the gate insulation film 146 to cover the gate electrode 147. Thereafter, the wiring layer 150 is formed above the first inter-layer insulation film 148.

In the process of forming the wiring layer 150, a second through electrode layer 182 is also formed in the through hole 170. Therefore, the wiring layer 150 and the second through electrode layer 182 are formed of the same material and in the same process. Thus, the first through electrode layer 181 and the second through electrode layer 182 are electrically connected to each other.

Figure 7:
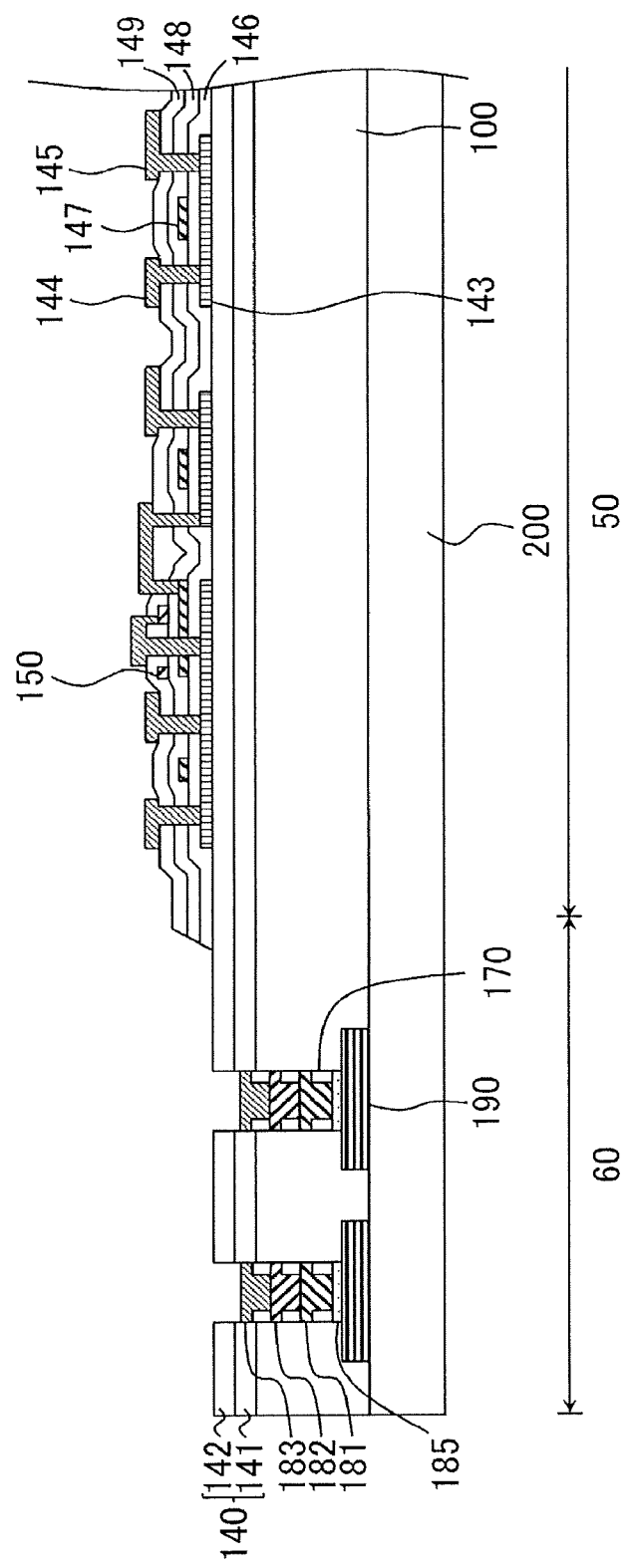
FIG. 7 is a schematic vertical sectional view taken along the cross-sectional surface A-A of FIG. 2 to describe the process of manufacturing the display device according to the first embodiment of the present invention.

FIG. 7 is a schematic vertical sectional view illustrating the substrate 100 after the process of forming the source electrode 144 and the drain electrode 145 on the cross-sectional surface A-A of FIG. 2. After the wiring layer 150 and the second through electrode layer 182 are formed, the second inter-layer insulation film 149 is formed on the first inter-layer insulation film 148 to cover the wiring layer 150.

After the second inter-layer insulation film 149 is formed, a plurality of contact holes are formed in the gate insulation film 146, the first inter-layer insulation film 148, and the second inter-layer insulation film 149 using a known method such as photolithography. Thus, a part of the semiconductor layer 143 is exposed. Then, the source electrode 144 and the drain electrode 145 are formed so that the formed contact holes are buried. Thus, at least a part of the driving TFT 125 is formed.

In the process of forming the source electrode 144 and the drain electrode 145, a third through electrode layer 183 is formed in the through hole 170. Therefore, the source electrode 144 and the drain electrode 145, and the third through electrode layer 183 are formed of the same material and in the same process. Thus, the second through electrode layer 182 and the third through electrode layer 183 are electrically connected to each other.

Figure 8:
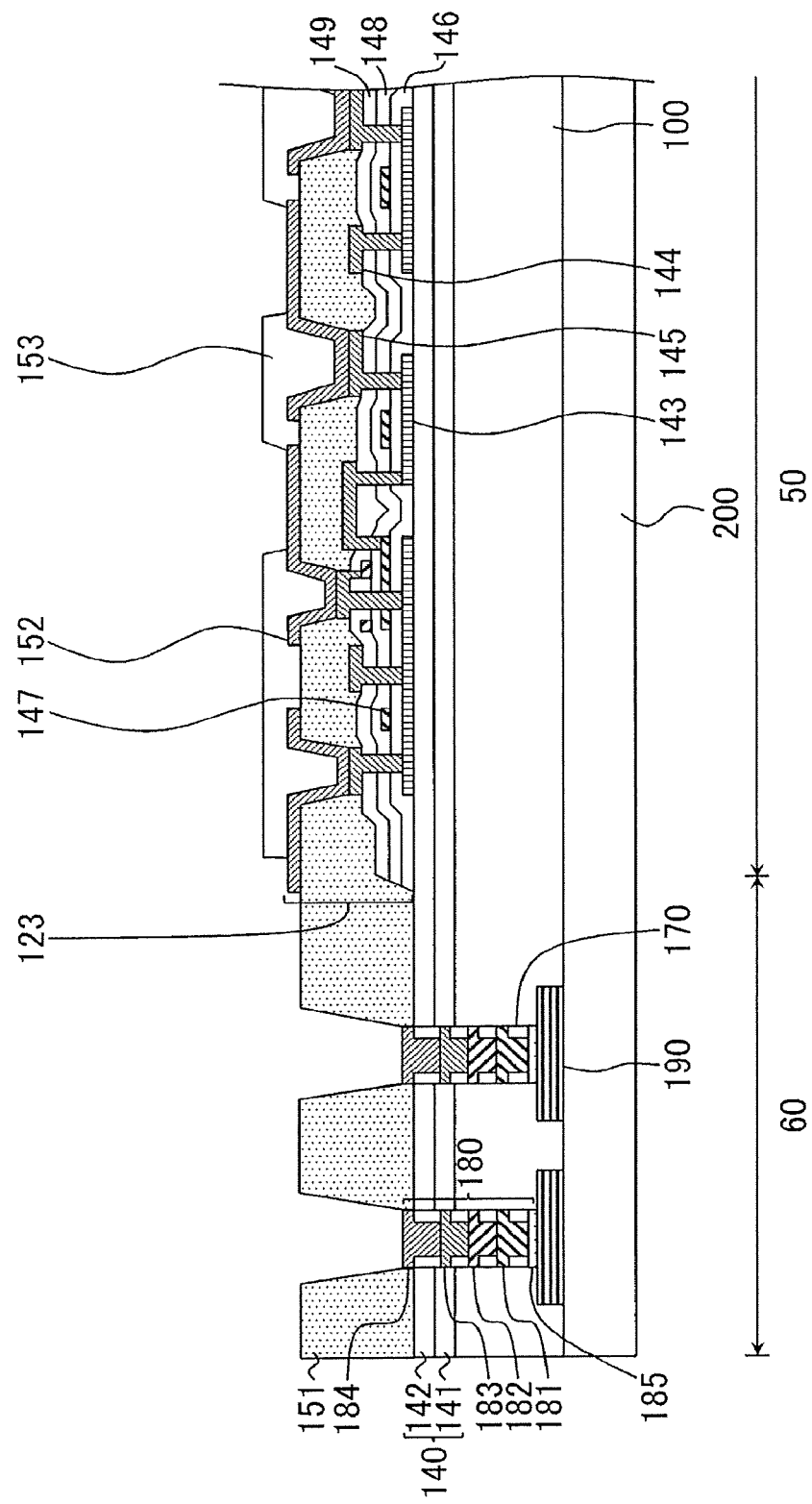
FIG. 8 is a schematic vertical sectional view taken along the cross-sectional surface A-A of FIG. 2 to describe the process of manufacturing the display device according to the first embodiment of the present invention.

FIG. 8 is a schematic vertical sectional view illustrating the display substrate of the display device 10 after the process of forming the bank 153 on the cross-sectional surface A-A of FIG. 2. After the source electrode 144 and the drain electrode 145, and the third through electrode layer 183 are formed, the passivation film 151 is formed above the second inter-layer insulation film 149 to cover the source electrode 144 and the drain electrode 145.

After the passivation film 151 is formed, a contact hole is formed in the passivation film 151 using a known method such as photolithography. Thus, a part of the drain electrode 145 is exposed in the display region 50. Then, the pixel electrode 152 is formed along the shape of the formed contact hole. By forming the contact hole in the portion of the through hole 170 also in the peripheral region 60, at least a part of the third through electrode layer 183 is exposed.

In the process of forming the pixel electrode 152, a fourth through electrode layer 184 is also formed from the formed contact hole in the through hole 170. Therefore, the pixel electrode 152 and the fourth through electrode layer 184 are formed of the same material and in the same process. Thus, the third through electrode layer 183 and the fourth through electrode layer 184 are electrically connected to each other.

After the pixel electrode 152 and the fourth through electrode layer 184 are formed, the bank 153 is formed between the formed pixel electrodes 152 to partition the plurality of pixels.

Figure 9:
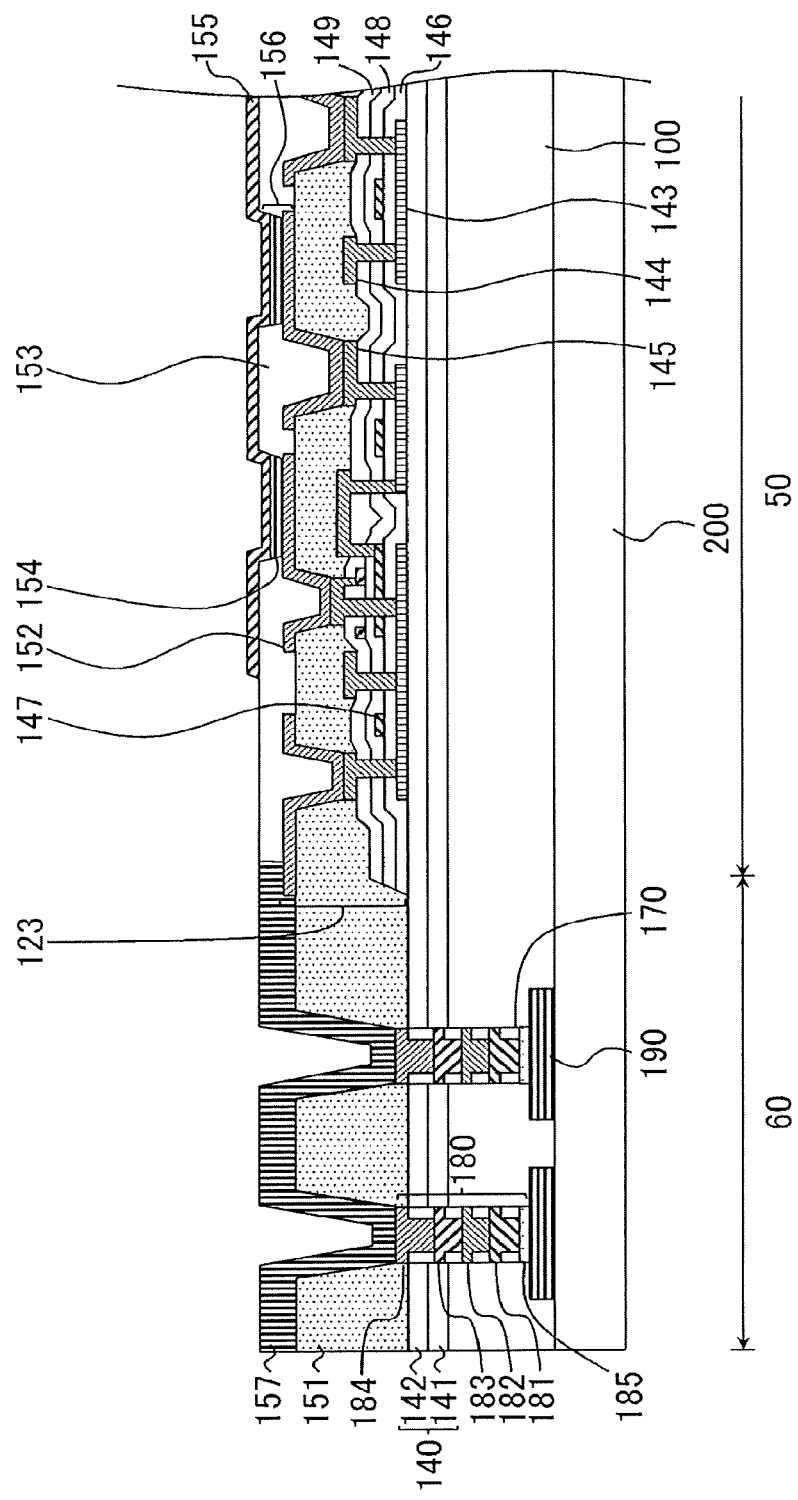
FIG. 9 is a schematic vertical sectional view taken along the cross-sectional surface A-A of FIG. 2 to describe the process of manufacturing the display device according to the first embodiment of the present invention.

FIG. 9 is a schematic vertical sectional view illustrating the display substrate of the display device 10 after the process of forming the conductive film 157 on the cross-sectional surface A-A of FIG. 2. After the bank 153 is formed, the light-emitting layer 154 is formed on the pixel electrode 152. The light-emitting layer 154 may be in contact with at least the pixel electrode 152. The light-emitting layer 154 may be formed to continue above the pixel electrode 152 and the bank 153. The common electrode 155 is formed on the formed light-emitting layer 154. Thus, at least a part of the light-emitting element 156 is formed.

After the common electrode 155 is formed, the conductive film 157 is formed along the shape of the contact hole formed in the peripheral region 60. The conductive film 157 is formed to be electrically connected to a part of the pixel electrode 152 and the fourth through electrode layer 184. The sealing film 158 sealing the laminate structure formed above the underlying layer 140 through the processes so far is formed above a part of the bank 153, the common electrode 155, and the conductive film 157. Thereafter, the display substrate of the display device 10 illustrated in FIG. 3 is formed through a process of peeling the glass substrate 200.

Figure 10:
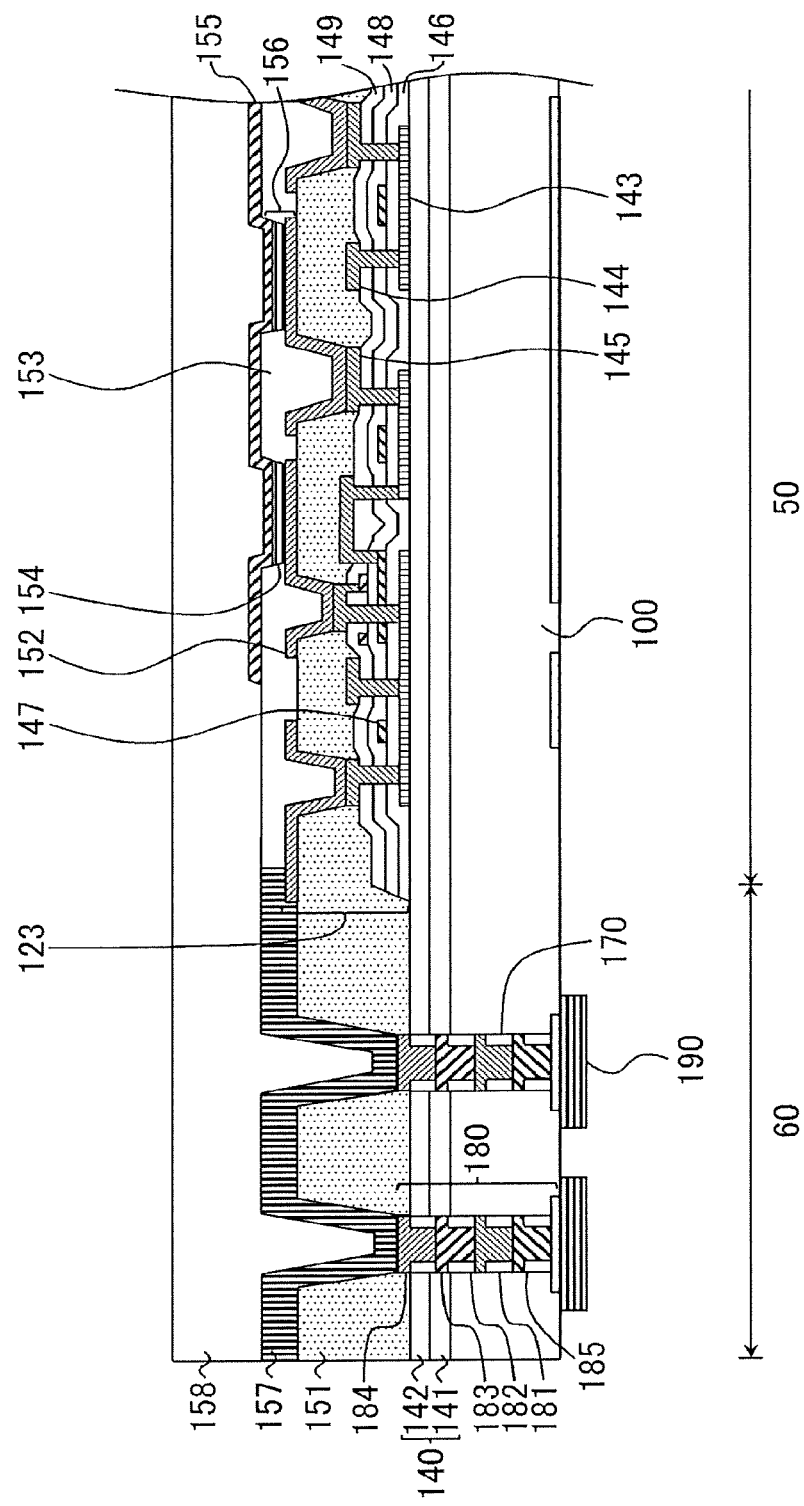
FIG. 10 is a schematic vertical sectional view taken along the cross-sectional surface A-A of FIG. 2 in a modification example of the display device according to the first embodiment of the present invention.

FIG. 10 is a schematic vertical sectional view illustrating the cross-sectional surface A-A of FIG. 2 in a modification example of the display substrate of the display device 10 according to the first embodiment of the present invention. In FIGS. 3 to 9, as described above, the electronic component 190 is provided in advance above the glass substrate 200 and the substrate 100 is formed to cover the electronic component 190. In a modification example illustrated in FIG. 10, however, the substrate 100 is formed without providing the electronic component 190 above the glass substrate 200. Moreover, after the glass substrate 200 is peeled, the electronic component 190 is provided on the rear surface side of the substrate 100 to be electrically connected to the through electrode 180, particularly, the first through electrode layer 181.

In the first embodiment, after the passivation film 151 is also formed in the peripheral region 60, photolithography is performed to form the fourth through electrode layer 184, but a structure in which the passivation film 151 is not formed in the peripheral region 60 may be realized. Here, the fourth through electrode layer 184 is formed without forming the passivation film 151 in the peripheral region 60, and the conductive film 157 is formed to be electrically connected to a part of the pixel electrode 152 and the fourth through electrode layer 184.

Alternatively, the passivation film 151 may be separately formed in the peripheral region 60. Here, the passivation film 151 is first formed in only the display region 50. Then, after the fourth through electrode layer 184 is formed, the passivation film 151 is formed in the peripheral region 60. In the formed passivation film 151, a contact hole is formed in the portion of the through hole 170 using a known method such as photolithography. Thus, at least a part of the fourth through electrode layer 184 is exposed. Thereafter, the conductive film 157 is formed to be electrically connected to a part of the pixel electrode 152 and the exposed fourth through electrode layer 184.

The conductive material 185 provided between the first through electrode layer 181 and the electronic component 190 may be applied after the glass substrate 200 is peeled and before the electronic component 190 is provided. Alternatively, after the conductive material 185 is provided in advance above the glass substrate 200, the substrate 100 may be formed.

Second Embodiment

Hereinafter, a display device 10 according to a second embodiment of the present invention will be described below with reference to FIGS. 11 to 18. Description of the same processes as those of the above-described first embodiment will not be repeated in detail.

Figure 11:
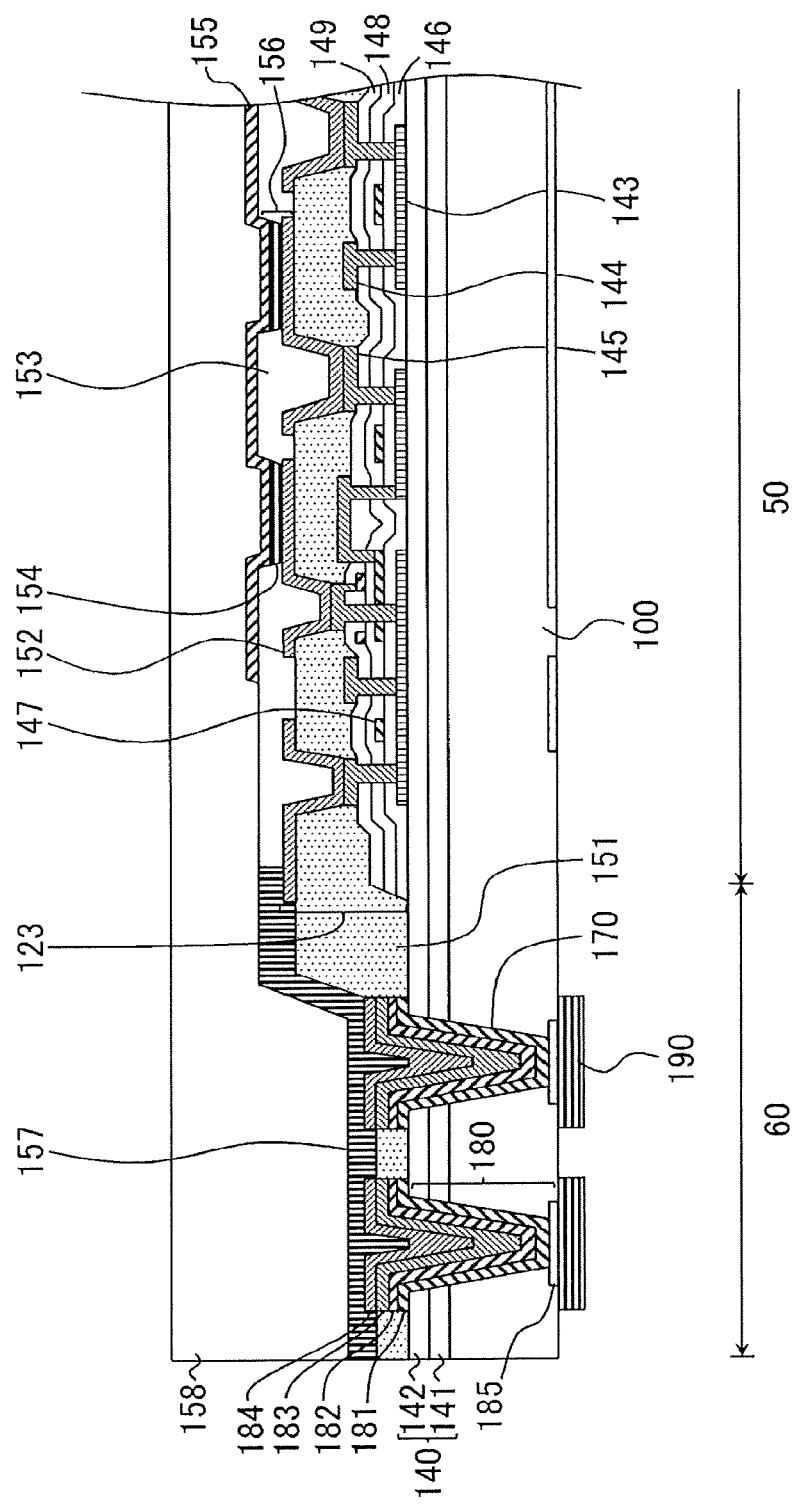
FIG. 11 is a schematic vertical sectional view taken along the cross-sectional surface A-A of FIG. 2 in a display device according to a second embodiment of the present invention.

FIG. 11 is a schematic vertical sectional view illustrating a display substrate of the display device 10 on the cross-sectional surface A-A of FIG. 2 according to the second embodiment of the present invention. In the second embodiment, unlike the first embodiment, the through hole 170 is not provided with a columnar shape, but is formed to have a shape (for example, a frustum or the like) in which a cross-sectional area of a hole increases from the rear surface side to the front surface side of the substrate 100. The first through electrode layer 181 to the fourth through electrode layer 184 are formed to cover at least the conductive material 185, as illustrated in FIG. 11, and to cover the edge of the through hole 170.

Figure 12:
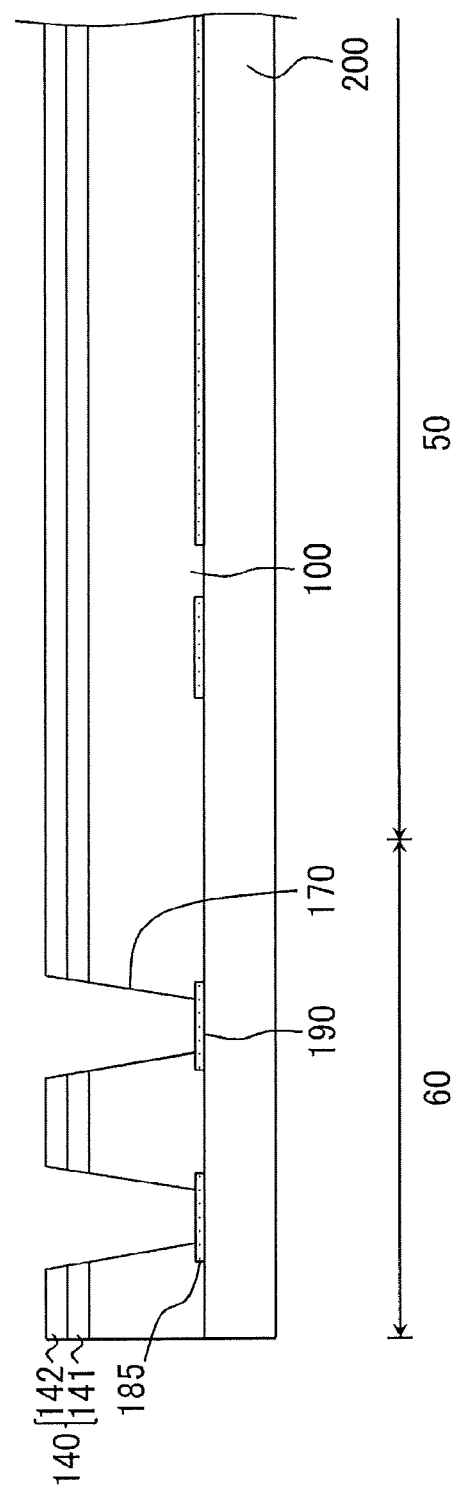
FIG. 12 is a schematic vertical sectional view taken along the cross-sectional surface A-A of FIG. 2 to describe a process of manufacturing the display device according to the second embodiment of the present invention.

Hereinafter, a process of manufacturing a display substrate of the display device 10 illustrated in FIG. 11 will be described with reference to FIGS. 12 to 17. FIG. 12 is a schematic vertical sectional view illustrating the display substrate after the process of forming the through hole 170 on the cross-sectional surface A-A of FIG. 2.

First, like the first embodiment, the substrate 100 is formed above the glass substrate 200 and the underlying layer 140 is formed above the substrate 100. Herein, the first underlying layer 141 and the second underlying layer 142 are sequentially formed from the side of the substrate 100. Here, after the conductive material 185 is formed in advance above the glass substrate 200, the substrate 100 is formed. The conductive material 185 has a structure in which the conductive material 185 is buried in the substrate 100.

After the underlying layer 140 is formed, as illustrated in FIG. 4, the through hole 170 from the underlying layer 140 to the conductive material 185 is formed using a known method such as photolithography. As described above, the through hole 170 is formed so that the size of a hole increases toward the front surface side of the substrate 100.

Figure 13:
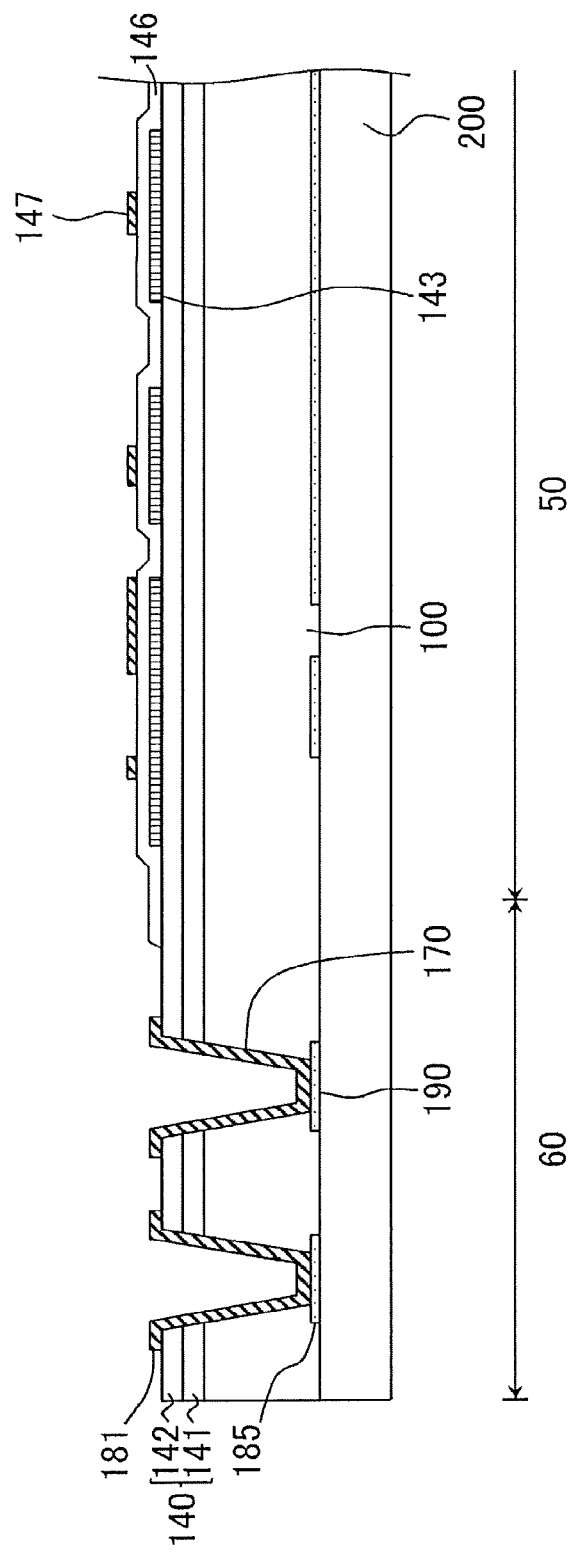
FIG. 13 is a schematic vertical sectional view taken along the cross-sectional surface A-A of FIG. 2 to describe the process of manufacturing the display device according to the second embodiment of the present invention.

FIG. 13 is a schematic vertical sectional view illustrating a display substrate of the display device 10 after the process of forming the gate electrode 147 on the cross-sectional surface A-A of FIG. 2. After the through hole 170 is formed, the semiconductor layer 143 is formed above the underlying layer 140. Here, the semiconductor layer 143 is formed above the second underlying layer 142. Then, the gate insulation film 146 is formed on the underlying layer 140 to cover the semiconductor layer 143. Moreover, the gate electrode 147 is formed on the gate insulation film 146 so that the gate electrode 147 is immediately above the semiconductor layer 143.

In the process of forming the gate electrode 147, the first through electrode layer 181 is also formed in the through hole 170. Therefore, the gate electrode 147 and the first through electrode layer 181 are formed of the same material and in the same process. Thus, the conductive material 185 and the first through electrode layer 181 are electrically connected to each other. Here, as described above, the recessed first through electrode layer 181 having an end portion in the edge of the through hole 170 is formed.

Figure 14:
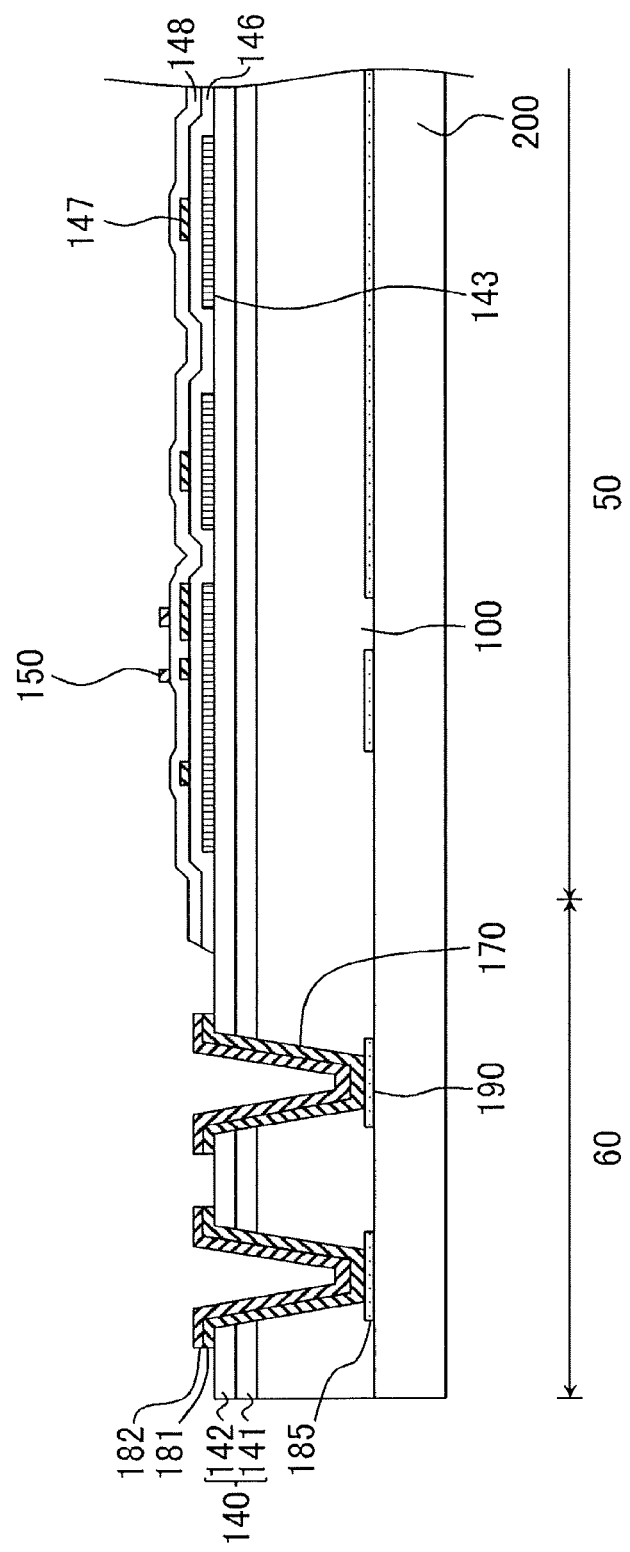
FIG. 14 is a schematic vertical sectional view taken along the cross-sectional surface A-A of FIG. 2 to describe the process of manufacturing the display device according to the second embodiment of the present invention.

FIG. 14 is a schematic vertical sectional view illustrating the display substrate of the display device 10 after the process of forming the wiring layer 150 on the cross-sectional surface A-A of FIG. 2. After the gate electrode 147 and the first through electrode layer 181 are formed, the first inter-layer insulation film 148 is formed above the gate insulation film 146 to cover the gate electrode 147. Thereafter, the wiring layer 150 is formed above the first inter-layer insulation film 148.

In the process of forming the wiring layer 150, the second through electrode layer 182 is also formed in the through hole 170. Therefore, the wiring layer 150 and the second through electrode layer 182 are formed of the same material and in the same process. Thus, the first through electrode layer 181 and the second through electrode layer 182 are electrically connected to each other. Here, as described above, the recessed second through electrode layer 182 having an end portion in the edge of the through hole 170 is formed.

Figure 15:
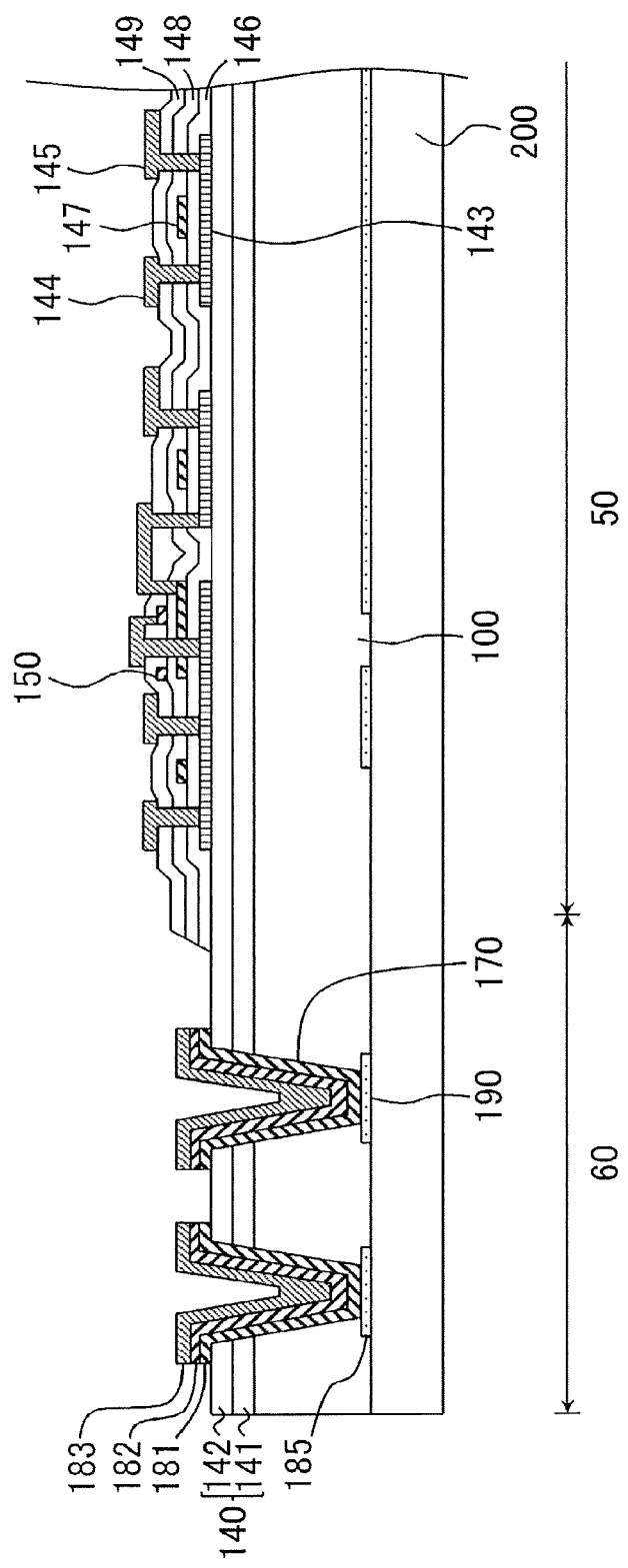
FIG. 15 is a schematic vertical sectional view taken along the cross-sectional surface A-A of FIG. 2 to describe the process of manufacturing the display device according to the second embodiment of the present invention.

FIG. 15 is a schematic vertical sectional view illustrating the display substrate of the disply device 10 after the process of forming the source electrode 144 and the drain electrode 145 on the cross-sectional surface A-A of FIG. 2. After the wiring layer 150 and the second through electrode layer 182 are formed, the second inter-layer insulation film 149 is formed on the first inter-layer insulation film 148 to cover the wiring layer 150.

After the second inter-layer insulation film 149 is formed, a plurality of contact holes are formed in the gate insulation film 146, the first inter-layer insulation film 148, and the second inter-layer insulation film 149 using a known method such as photolithography. Thus, a part of the semiconductor layer 143 is exposed. Then, the source electrode 144 and the drain electrode 145 are formed so that the formed contact holes are buried. Thus, at least a part of the driving TFT 125 is formed.

In the process of forming the source electrode 144 and the drain electrode 145, the third through electrode layer 183 is also formed in the through hole 170. Therefore, the source electrode 144 and the drain electrode 145, and the third through electrode layer 183 are formed of the same material and in the same process. Thus, the second through electrode layer 182 and the third through electrode layer 183 are electrically connected to each other. Here, as described above, the recessed third through electrode layer 183 having an end portion in the edge of the through hole 170 is formed.

Figure 16:
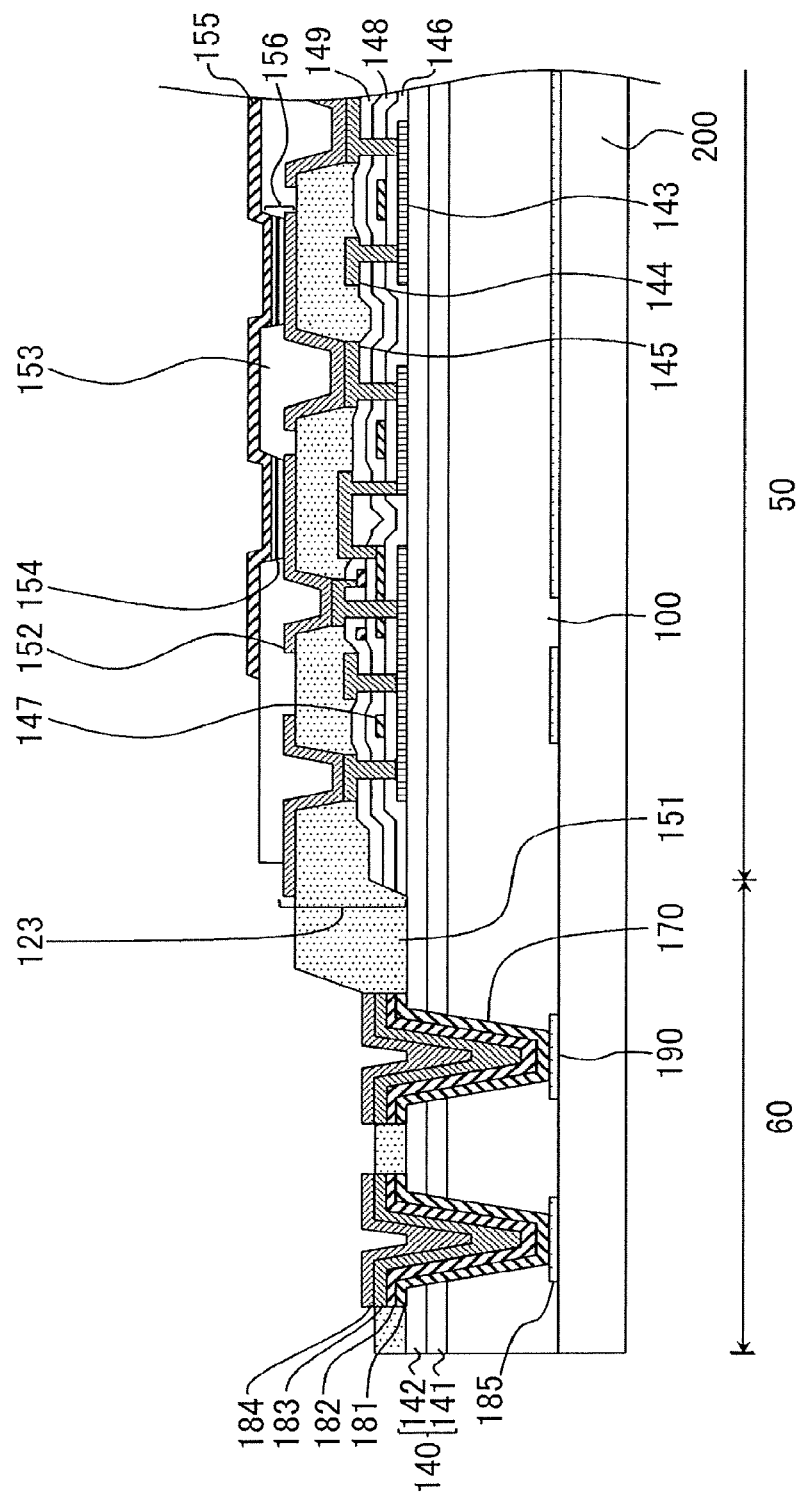
FIG. 16 is a schematic vertical sectional view taken along the cross-sectional surface A-A of FIG. 2 to describe the process of manufacturing the display device according to the second embodiment of the present invention.

FIG. 16 is a schematic vertical sectional view illustrating the display substrate of the display device 10 after the process of forming the bank 153 on the cross-sectional surface A-A of FIG. 2. After the source electrode 144 and the drain electrode 145, and the third through electrode layer 183 are formed, the passivation film 151 is formed above the second inter-layer insulation film 149 to cover the source electrode 144 and the drain electrode 145. In the second embodiment, a film thickness of the passivation film 151 in the peripheral region 60 is formed so that the film thickness is equal to or less than a thickness from the first through electrode layer 181 to the third through electrode layer 183 formed above the second underlying layer 142.

After the passivation film 151 is formed, a contact hole is formed in the passivation film 151 using a known method such as photolithography. Thus, a part of the drain electrode 145 is exposed in the display region 50. Then, the pixel electrode 152 is formed along the shape of the formed contact hole.

In the process of forming the pixel electrode 152, a fourth through electrode layer 184 is also formed in the through hole 170. Therefore, the pixel electrode 152 and the fourth through electrode layer 184 are formed of the same material and in the same process. Thus, the third through electrode layer 183 and the fourth through electrode layer 184 are electrically connected to each other. Here, as described above, the recessed fourth through electrode layer 184 having an end portion in the edge of the through hole 170 is formed.

After the pixel electrode 152 and the fourth through electrode layer 184 are formed, the bank 153 is formed between the formed pixel electrodes 152 to partition the plurality of pixels.

Figure 17:
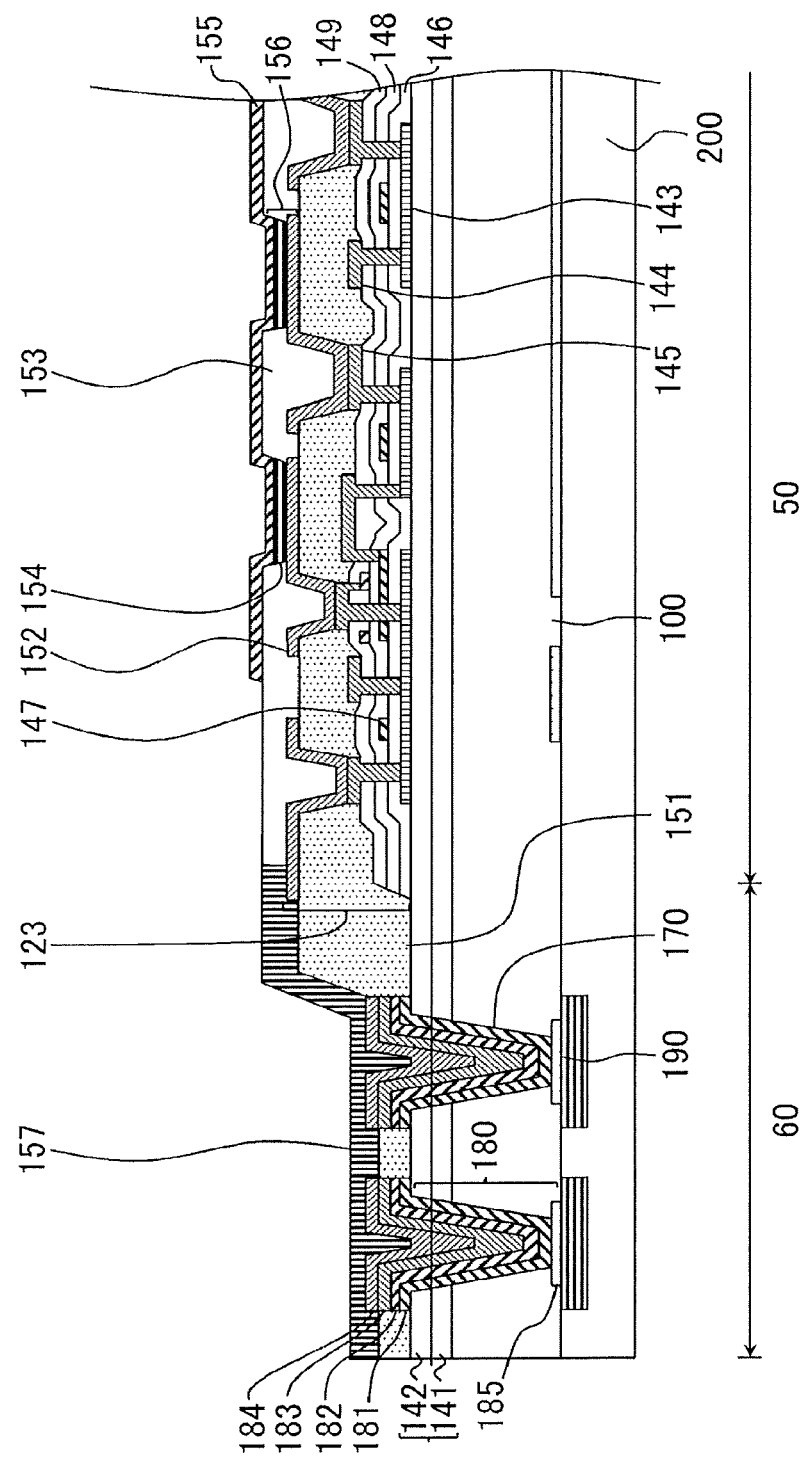
FIG. 17 is a schematic vertical sectional view taken along the cross-sectional surface A-A of FIG. 2 to describe the process of manufacturing the display device according to the second embodiment of the present invention.

FIG. 17 is a schematic vertical sectional view illustrating the display substrate of the display device 10 after the process of forming the conductive film 157 on the cross-sectional surface A-A of FIG. 2. After the bank 153 is formed, the light-emitting layer 154 is formed on the pixel electrode 152. The light-emitting layer 154 may be in contact with at least the pixel electrode 152. The light-emitting layer 154 may be formed to continue above the pixel electrode 152 and the bank 153. The common electrode 155 is formed on the formed light-emitting layer 154. Thus, at least a part of the light-emitting element 156 is formed.

After the common electrode 155 is formed, the conductive film 157 is formed along the shape of the contact hole formed in the peripheral region 60. The conductive film 157 is formed to be electrically connected to a part of the pixel electrode 152 and the fourth through electrode layer 184. The sealing film 158 sealing the laminate structure formed above the underlying layer 140 through the processes so far is formed above a part of the bank 153, the common electrode 155, and the conductive film 157. Thereafter, by peeling the glass substrate 200 and providing the electronic component 190 in a portion in which the conductive material 185 is exposed on the rear surface side of the substrate 100, the substrate 100 illustrated in FIG. 11 is formed.

Figure 18:
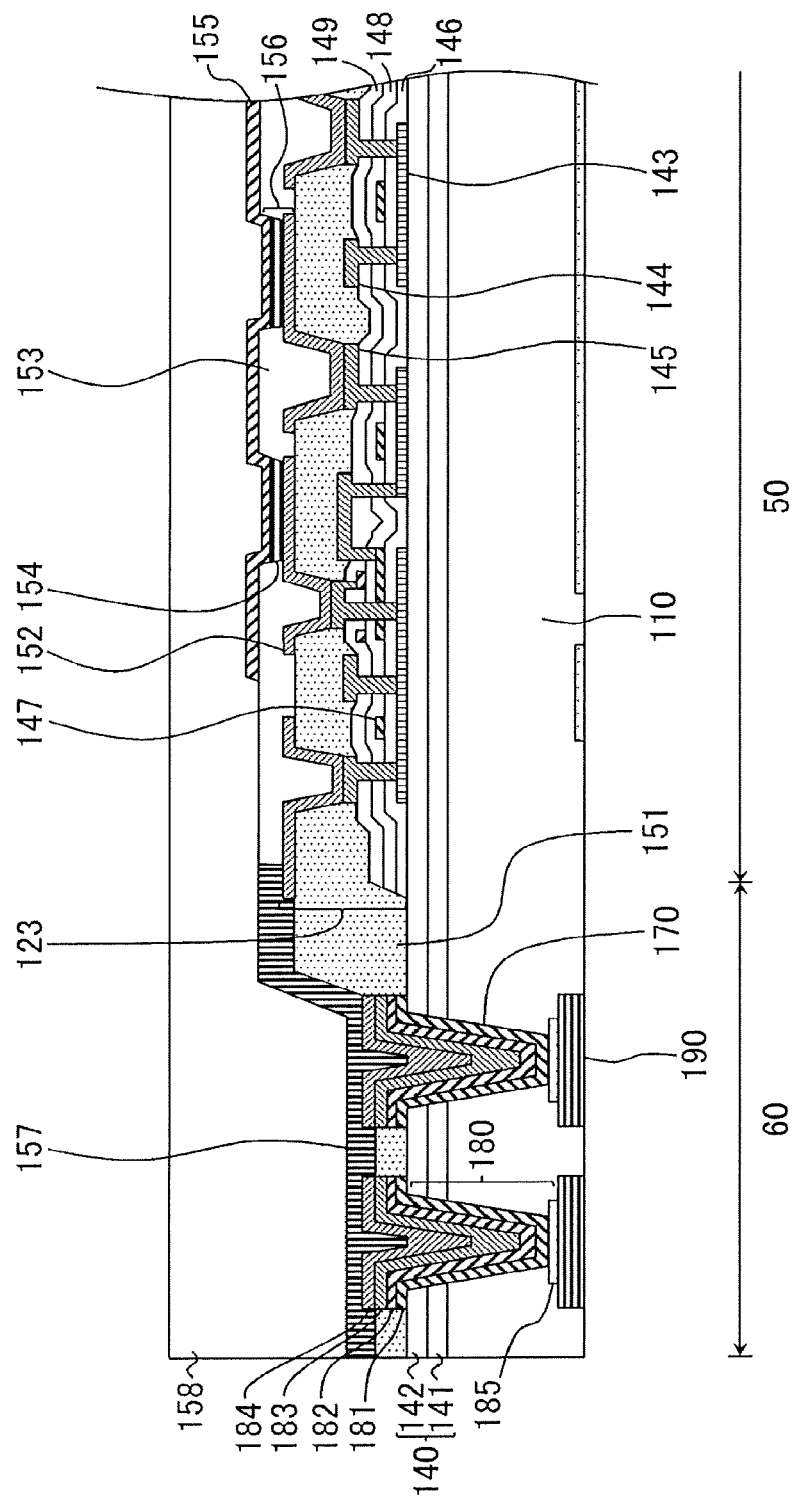
FIG. 18 is a schematic vertical sectional view taken along the cross-sectional surface A-A of FIG. 2 in a modification example of the display device according to the second embodiment of the present invention.

FIG. 18 is a schematic vertical sectional view illustrating the cross-sectional surface A-A of FIG. 2 in a modification example of the display substrate of the display device 10 according to the second embodiment of the present invention. In FIGS. 11 to 17, the electronic component 190 is not formed and the conductive material 185 is provided above the glass substrate 200, and then the substrate 100 is formed. In a modification example illustrated in FIG. 18, however, the electronic component 190 is formed in advance above the glass substrate 200 and the substrate 100 is formed to cover the electronic component 190 like the display substrate illustrated in FIG. 3.

In the electric connection between the through electrode 180 and the electronic component 190, as described above, after the electronic component 190 is provided in advance above the glass substrate 200 to be peeled later, the electronic component 190 may be connected to the through electrode 180 via the conductive material 185. After the glass substrate 200 is peeled, the conductive material 185 and the electronic component 190 may be provided in a portion (the first through electrode layer 181) of the through electrode 180 exposed to the rear surface side of the substrate 100.

In the second embodiment, the passivation film 151 is also formed not to be thicker than the film thickness of the through electrode 180 formed above the second underlying layer 142 of the peripheral region 60, but a structure in which the passivation film 151 is not formed in the peripheral region 60 may be realized. Here, the fourth through electrode layer 184 is formed without forming the passivation film 151 in the peripheral region 60, and the conductive film 157 is formed to be electrically connected to a part of the pixel electrode 152 and the fourth through electrode layer 184.

Alternatively, the passivation film 151 may be separately formed in the peripheral region 60. Here, the passivation film 151 is first formed in only the display region 50. Then, after the fourth through electrode layer 184 is formed, the passivation film 151 is formed in the peripheral region 60. In the formed passivation film 151, a contact hole is formed in the portion of the through hole 170 using a known method such as photolithography. Thus, at least a part of the fourth through electrode layer 184 is exposed. Thereafter, the conductive film 157 is formed to be electrically connected to a part of the pixel electrode 152 and the exposed fourth through electrode layer 184. Other than the above, like the first embodiment, after the passivation film 151 is formed across the display region 50 and the peripheral region 60, a contact hole may be formed in the portion of the through hole 170 using a known method such as photolithography, and the fourth through electrode layer 184 and the conductive film 158 may be formed.

As a material of which the first through electrode layer 181 is formed, for example, molybdenum-tungsten (MoW) can be exemplified. As a material of which the second through electrode layer 182 and the third through electrode layer 183 are formed, for example, titanium-aluminum (Ti/Al/Ti) can be exemplified. As a material of which the fourth through electrode layer 184 is formed, for example, ITO/Ag/ITO which is a transparent conductive film can be exemplified. Moreover, a difference in a thermal expansion coefficient between the conductive film 158, the first through electrode layer 181 to the fourth through electrode layer 184, and the conductive material 185 is preferably within 10% and is more preferably within several percents.

Since a process of forming a through electrode in a via last process of the related art is performed under normal atmosphere conditions, moisture may intrude into a substrate at the time point at which the through hole is formed, and thus reliability of a display device is likely to deteriorate. However, as described above, when a through electrode formed by a plurality of conductive layers is formed in a process of forming a display substrate, the process is performed in an environment in which moisture is very unlikely to intrude from the through hole formed in the substrate. Therefore, it is possible to considerably improve the likelihood of the reliability of the display device deteriorating.

The case of the organic EL display device has been exemplified as the disclosure examples in the first and second embodiments, but examples of other application examples include all kinds of flat panel display devices such as a liquid crystal display device, other spontaneous display devices, and an electronic paper type display device including an electrophoretic element. It is needless to say that the embodiments can be applied to small, medium, and large-sized display devices without being particularly limited.

It is apparent to those skilled in the art that various modification examples and correction examples can be made within the scope of the present invention, and the modification examples and the correction examples are understood to be within the scope of the present invention. For example, addition, deletion, or design change of the constituent elements and addition, omission, or condition change of the processes in the above-described embodiments by those skilled in the art can be included in the scope of the present invention as long as these are within the gist of the present invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
    a substrate that includes a display region and a peripheral region;
    a display element including a thin film transistor that is provided on the display region of the substrate; and
    an electronic component that is provided in the peripheral region on an opposite surface from a surface of the substrate on which the display element is provided, wherein
    the substrate includes a through hole in the peripheral region,
    the through hole includes a through electrode formed by a laminate structure of a plurality of conductive layers,
    the through electrode electrically connect the display element to the electronic component, and
    the plurality of conductive layers of the through electrode include a same material as a gate electrode and a drain or a source electrode of the thin film transistor.

2. The display device according to claim 1, further comprising:
    a conductive film provided on an opposite surface from a surface of the substrate on which the display element is provided, wherein
    the electronic component is electrically connected to the through electrode via the conductive film.

3. The display device according to claim 1, wherein the display element includes
    a wiring layer electrically connected to the through electrode,
    an upper electrode electrically connected to the wiring layer, and
    a light-emitting layer electrically connected to the upper electrode.

4. The display device according to claim 1, wherein the substrate includes a resin with flexibility.

5. The display device according to claim 1, wherein the electronic component is an integrated circuit.

6. The display device according to claim 1, wherein the electronic component is a flexible printed substrate.

7. A method of manufacturing a display device including a substrate that includes a display region and a peripheral region, a display element having a thin film transistor that is provided on the display region of the substrate, and an electronic component that is provided in the peripheral region on an opposite surface from a surface of the substrate on which the display element is provided, the method comprising:
    forming a through hole in the peripheral region of the substrate;
    forming a gate electrode of the thin film transistor and a first through electrode layer in the through hole:
    forming a wiring layer and a second through electrode layer in the through hole;
    forming a source electrode and a drain electrode of the thin film transistor, and a third through electrode layer in the through hole; and
    electrically connecting the electronic component that is provided on an opposite surface from a surface of the substrate on which the display element is provided among the through hole.

8. The method of manufacturing the display device according to claim 7, further comprising:
    forming a conductive film provided on an opposite surface from a surface of the substrate on which the display element is provided; and
    electrically connecting the through electrode to the electronic component via the conductive film.

* * * * *